United States Patent [19]

Nahory et al.

[11] 4,374,867

[45] Feb. 22, 1983

[54] METHOD OF GROWING OXIDE LAYER ON INDIUM GALLIUM ARSENIDE

[75] Inventors: Robert E. Nahory, Lincroft; Benjamin Tell, Aberdeen, both of N.J.

[73] Assignee: Bell Telephone Laboratories, Incorporated, Murray Hill, N.J.

[21] Appl. No.: 318,803

[22] Filed: Nov. 6, 1981

[51] Int. Cl.³ .................. B05D 3/14; B05D 5/12; B05D 7/24
[52] U.S. Cl. .................. 427/38; 204/192 E; 427/39
[58] Field of Search .............. 427/38, 39; 204/192 E

[56] References Cited

PUBLICATIONS

Sakai et al., "InGaAsP/InP Photodiodes Antireflectively Coated with InP Native Oxide," IEEE Journal of Quantum Electronics, vol. QE-15, No. 10, Oct. 1979, pp. 1077-1078.

Chang, "Selective Plasma Oxidation of GaAs-A Study of the Interface Properties," Proc. of 11th Conf. on Solid State Devices, 1979, pp. 483-487.

Law, "Anodic Oxidation of InGaAsP," Appl. Physics Letters, vol. 37, No. 1, Jul. 1980, pp. 68-70.

Primary Examiner—James R. Hoffman
Attorney, Agent, or Firm—Daniel D. Dubosky

[57] ABSTRACT

A method of growing a water insoluble native plasma oxide on an $In_{0.53}Ga_{0.47}As$ layer of the type that is useful in the fabrication of MOS type devices is disclosed. Oxygen is bubbled through a water chamber in order to introduce water vapor into the growth chamber during the growing process. The InGaAs layer is first sputter etched in the oxygen plasma while a negative potential is applied to the semiconductor structure. The pressure is then increased and the oxides are grown while a positive potential is applied to the semiconductor structure.

6 Claims, 1 Drawing Figure

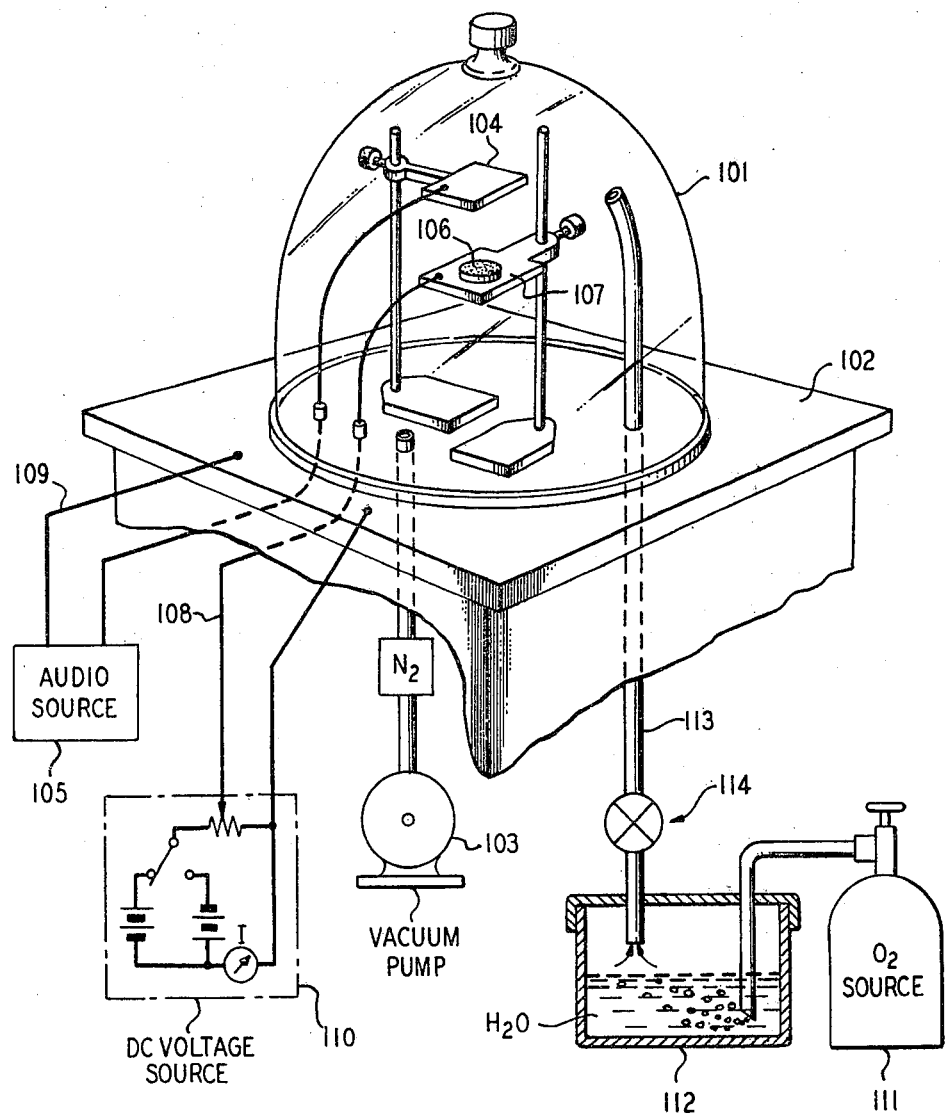

METHOD OF GROWING OXIDE LAYER ON INDIUM GALLIUM ARSENIDE

BACKGROUND OF THE INVENTION $In_{0.53}Ga_{0.47}As$ is a potentially attractive material for discrete and integrated optical and microwave device applications. This ternary has the highest mobility among all compositions in the quaternary system InGaAsP which is lattice matched to InP. At high electric field strengths, carrier velocities are expected to be large for the ternary material according to Monte Carlo calculations. Direct measurements have been made of the high field drift velocity of electrons in InGaAs giving values that are larger than the drift velocities in GaAs. Accordingly, very fast devices would be attainable with InGaAs. Many of these devices of the MOS type will require that an oxide layer be grown on InGaAs.

There has been a previous report of a native oxide grown in a lattice matched alloy system using InGaAsP on an InP substrate. This previously reported native oxide was grown by using an anodization process. See the article entitled "Anodic Oxidation of InGaAsP," by H. D. Law *Applied Physics Letters,* Vol. 37, No. 1, July 1980. In general, anodic oxides of III-V compounds have the following disadvantages: they are hygroscopic, they contain a high density of interface states which renders them useless for electrical devices, and they are mechanically or physically soft so they are easily damaged.

SUMMARY OF THE INVENTION

A highly stable water insoluble native oxide layer is grown on InGaAs by placing the sample in a growth chamber that has been evacuated and in which an oxygen plasma is established. The sample is placed on an electrode which can be positioned within the plasma and dc biased with respect to the plasma. Water vapor is introduced into the growth chamber during the growing process. The sample is first sputter etched by applying a negative potential to the sample electrode. The pressure is then increased and the oxides are grown by applying a positive potential of 30–70 volts to the sample electrode.

BRIEF DESCRIPTION OF THE DRAWING

The invention will be more readily understood after reading the following detailed description in conjunction with the drawing wherein the single FIGURE provides a pictorial and schematic block illustration of an apparatus that can be used to practice the present invention.

DETAILED DESCRIPTION

The samples which were used in the embodiments of the present invention were obtained by growing $In_{0.53}Ga_{0.47}As$ layers by the well-known liquid phase epitaxial process at 645 degrees C. by using the usual horizontal boat and slider technique. The grown layers were approximately 2 μm thick and were lattice matched to better than 0.05 percent to the <100> surface of an indium phosphide substrate. The n-type samples were unintentionally doped on indium phosphide substrates having a tin doping with an n-type dopant concentration of about 1 to $3 \times 10^{16}$ cm$^{-3}$. The p-type samples that were used in the process were doped with zinc to achieve a dopant concentration of about $5 \times 10^{16}$ cm$^{-3}$ and were grown on indium phosphide substrates that had been doped with zinc.

The plasma oxidation was performed in a 30 cm diameter bell jar 101 which was placed on an aluminum base plate 102 and evacuated using a mechanical vacuum pump 103 having a liquid nitrogen cold trap to a pressure of ~1 millitorr or less. A $5 \times 5$ cm$^2$ stainless steel high voltage electrode 104 is placed in the bell jar 101 and connected to an audio source 105 by way of line 109. This audio source 105 delivers approximately 70 watts of a 50 kilohertz signal that is coupled between the high voltage electrode 104 and the aluminum base plate 102. Other frequencies, both higher and lower, have also produced oxide layers. The sample 106 onto which the oxide layer is to be grown is placed on a separate stainless steel electrode 107 which is positioned within the bell jar 101 at a point that is between the high voltage electrode 104 and the aluminum base plate 102. This sample electrode 107 is electrically connected by way of a wire 108 to a dc voltage source 110 that is external to the chamber. dc voltage source 110 is able to provide positive or negative potentials by way of line 108 to the sample electrode 107 relative to the aluminum base plate 102.

An oxygen source 111 is coupled to a water chamber 112 in a way such that the oxygen is bubbled through the water prior to the delivery of the oxygen and water vapor through a tube 113 and needle valve 114 into the vacuum chamber created by bell jar 101 and the aluminum base plate 102. Initially the samples are sputter etched for several minutes in an oxygen plasma having a pressure of about 60 millitorr by applying a negative potential of about 150 volts by way of line 108 to the sample electrode 107. The pressure is then increased to about 250 millitorr corresponding to a flow rate of ~3 cubic cm per sec and a positive potential from dc voltage source 110 of about 30–70 volts is then applied by way of line 108 to the sample electrode 107. During this application of the positive potential the oxide is grown on sample 106 and the current as measured by dc voltage source 110 has an initial value of about 0.5 to 2 milliamps per square cm of sample surface which drops appreciably by the end of the growth cycle.

The final oxide thickness that is achieved on the InGaAs layer was determined to be independent of whether the bare indium phosphide substrate was in contact with the sample electrode 107 or whether an evaporated and sintered gold or aluminum layer was applied to the substrate surface in order to improve the electrical contact. In addition, it has been determined that oxides can even be grown on InGaAs layers that have been grown on semi-insulating InP substrates by simply making a pressure contact between the sample electrode 107 and the bare ternary InGaAs surface.

The oxide layer that was achieved varied in color from light yellow when the sample electrode was connected to 30 volts during the growth process to a deep tan when the sample electrode was connected to 70 volts during the growth process. The thickness of the oxide layer (as judged by the color) appeared to saturate in time for a given voltage. At 70 volts the thickness was measured to be about 50 nanometers.

The water vapor was found to be a necessary element in the growth process. Oxides that were grown without the water vapor were found to be soluble in water. Simply leaving the oxide in atmospheric conditions overnight was found to produce physical degradation of the oxide layer. Oxides grown in the presence of water vapor on the other hand were found to be insoluble both in water and in ordinary organic solvents. These oxides were able to be processed using standard photolithographic techniques.

To check the electrical qualities of the oxide layers, MOS diodes were fabricated by thermally evaporating photolithographically defined aluminum dots on the oxide surface with a diameter of about 200 μm. A gold contact was evaporated onto the opposite surface of the heavily doped indium phosphide substrate. The oxides were heated in $H_2$ at 100 degrees C. to 150 degrees C. prior to the evaporation of the aluminum dots and then heated as high as 350 degrees C. for 15 minutes subsequent to the aluminum evaporation. Using these MOS diodes, the resistivity of the oxide at 2–3 volts gate bias was determined to be in the order of $10^{12}$ ohm-cm. The breakdown voltage of the oxide was determined to be slightly greater than $10^6$ volts/cm. With this type of oxide resistivity and breakdown field the oxide layers appear to insure that useful MOS devices can be fabricated.

While the oxides that were tested were grown on InGaAs layers, it should be readily apparent to those skilled in the art that similar oxides could be grown on InGaAsP particularly in those quaternary layers having a low concentration of the phosphorous element.

What is claimed is:

1. In a process for growing an oxide on an epitaxial layer consisting primarily of indium, gallium and arsenic by exposing the layer to a plasma of oxygen, the step of exposing the layer to water vapor during the growth of the oxide.

2. In a process for growing an oxide on an epitaxial layer as defined in claim 1 wherein the process further includes the step of applying a positive potential to said epitaxial layer during the growth process.

3. In a process for growing an oxide on an epitaxial layer as defined in claim 2 wherein the process further includes the step of applying a negative potential to said epitaxial layer prior to the application of said positive potential.

4. A process for growing an oxide on an epitaxial layer of a semiconductor structure consisting primarily of indium, gallium and arsenic comprising the steps of evacuating a growth chamber to a predetermined vacuum level, flowing oxygen and water vapor into said growth chamber to achieve a predetermined level of pressure, creating a plasma discharge within said growth chamber, and applying a positive potential to an electrode surface that supports the semiconductor structure having said epitaxial layer.

5. A process for growing an oxide on an epitaxial layer as defined in claim 4 wherein said process further includes the step of applying a negative potential to the electrode surface that supports the semiconductor structure having said epitaxial layer prior to the application of said positive potential.

6. A process for growing an oxide on an epitaxial layer as defined in claim 4 wherein the step of flowing oxygen and water vapor into the growth chamber includes the step of bubbling oxygen through a water chamber.

* * * * *

UNITED STATES PATENT AND TRADEMARK OFFICE
CERTIFICATE OF CORRECTION

PATENT NO. : 4,374,867
DATED : February 22, 1983
INVENTOR(S) : Robert E. Nahory and Benjamin Tell It is certified that error appears in the above—identified patent and that said Letters Patent is hereby corrected as shown below:

Column 2, line 34, "150" should read --250--.

Signed and Sealed this

Third Day of May 1983

[SEAL]

Attest:

GERALD J. MOSSINGHOFF

Attesting Officer

Commissioner of Patents and Trademarks